(12) United States Patent
Lim et al.

(10) Patent No.: US 6,380,084 B1
(45) Date of Patent: Apr. 30, 2002

(54) METHOD TO FORM HIGH PERFORMANCE COPPER DAMASCENE INTERCONNECTS BY DE-COUPLING VIA AND METAL LINE FILLING

(75) Inventors: Yeow Kheng Lim; Alex See; Cher Liang Cha; Subhash Gupta; Wang Ling Goh; Man Siu Tse, all of Singapore (SG)

(73) Assignee: Chartered Semiconductor Manufacturing Inc., Milpitas, CA (US)

( * ) Notice: Subject to any disclaimer, the term of this patent is extended or adjusted under 35 U.S.C. 154(b) by 58 days.

(21) Appl. No.: 09/678,621

(22) Filed: Oct. 2, 2000

(51) Int. Cl.[7] .............................................. H01L 21/44
(52) U.S. Cl. ....................... 438/687; 438/622; 438/637; 438/672; 438/675
(58) Field of Search ................................ 438/618, 622, 438/624, 625, 627, 629, 631, 634, 636–639, 643, 648, 652, 653, 656, 672, 675, 685, 687

(56) References Cited

U.S. PATENT DOCUMENTS

| | | | |
|---|---|---|---|
| 5,612,254 A | * 3/1997 | Mu et al. ...................... | 438/631 |
| 5,741,626 A | 4/1998 | Jain et al. .................... | 430/314 |
| 5,930,669 A | 7/1999 | Uzoh .......................... | 438/627 |
| 5,933,761 A | 8/1999 | Lee ............................. | 438/783 |
| 5,981,374 A | 11/1999 | Dalal et al. ................. | 438/624 |
| 6,040,243 A | 3/2000 | Li et al. ...................... | 438/687 |
| 6,147,404 A | * 11/2000 | Pramanick et al. ......... | 257/750 |

\* cited by examiner

*Primary Examiner*—Matthew Smith
*Assistant Examiner*—Craig P. Lytle
(74) *Attorney, Agent, or Firm*—George O. Saile; Rosemary L.S. Pike

(57) ABSTRACT

A method to form robust dual damascene interconnects by decoupling via and connective line trench filling has been achieved. A first dielectric layer is deposited overlying a silicon nitride layer. A shielding layer is deposited. The shielding layer, the first dielectric layer, and the silicon nitride layer are patterned to form via trenches. A first barrier layer is deposited to line the trenches. The via trenches are filled with a first copper layer by a single deposition or by depositing a seed layer and then electroless or electrochemical plating. The first copper layer is polished down to complete the vias. A second barrier layer is deposited. The second barrier layer is patterned to form via caps. A second dielectric layer is deposited. A capping layer is deposited. The capping layer and the second dielectric layer are patterned to form connective line trenches that expose a part of the via caps. A third barrier layer is deposited to line the connective line trenches. The third barrier layer and the via caps are etched to form trench barrier sidewall spacers and to expose the vias. The connective line trenches are filled with a second copper layer by a single deposition, by a first deposition of a seed layer followed by plating, or by plating using the via as the seed layer. The second copper layer is polished down.

33 Claims, 12 Drawing Sheets

METHOD TO FORM HIGH PERFORMANCE COPPER DAMASCENE INTERCONNECTS BY DE-COUPLING VIA AND METAL LINE FILLING

BACKGROUND OF THE INVENTION

1. Field of the Invention

The invention relates to a method of fabricating semiconductor structures, and more particularly, to the formation of dual damascene copper interconnects in the manufacture of integrated circuit devices.

2. Description of the Prior Art

Copper damascene interconnects are becoming increasingly common in the art of integrated circuit manufacture. Copper interconnects offer a significant advantage over aluminum interconnects because of the lower resistivity of copper. In copper damascene processes, trenches are patterned into a dielectric material. Copper is then blanket deposited overlying the dielectric material to fill the trenches. Finally, a polish down operation is performed to remove excess copper and to form the interconnect patterns within the confines of the trenches.

Referring to FIG. 1, a cross-section of a partially completed dual damascene structure in a prior art integrated circuit device is shown. In this interconnect structure, a level of connective lines will be formed overlying a conductive layer 18. Vias will also be formed to selectively connect the level of connective lines to the underlying conductive layer 18. An insulator layer 14 overlies a semiconductor substrate 10. The conductive layer 18 overlies the insulator layer 14. A first etch stopping layer 20 is formed overlying the conductive layer 18. A first dielectric layer 22 is formed overlying the first etch stopping layer 18. A second etch stopping, layer 26, typically comprising silicon nitride, overlies the first dielectric layer 22. A second dielectric layer 30 overlies the etch stopping layer 26. The second dielectric layer 30 is patterned to form an upper trench that may be called the connective line trench. Note that the presence of the second etch stopping layer 26 facilitates etching the second dielectric layer 30 to specific depth.

Referring now to FIG. 2, the etch stop layer 26 and the first dielectric layer 22 are patterned to form the lower trench, that is called the via trench. The first etch stopping layer 20 is then etched through to expose the underlying conductive layer 18.

Referring now to FIG. 3, a barrier layer 32 and a copper layer 34 are deposited and polished down to complete the dual damascene interconnect structure.

There are two significant problems in the prior art method. First, the first and second silicon nitride etch stopping layers 20 and 26 significantly increases the parasitic capacitance of the interconnect structure. Second, the copper layer 34 is deposited in both the via and connective line trenches in one process. Unfortunately, it is difficult to control the deposition rate of the copper layer 34 in both the high aspect ratio via trench and in the lower aspect ratio connective line trench. The properties of the copper layer 34 are thereby chronically degraded. Deposited copper grain sizes and texture change with the aspect ratio and the sidewall features. Therefore, the properties of the copper in the via are different from the properties of the copper in the trench. This is an important point that has been ignored until now. Poor copper layer filling, due to differences in the aspect ratios of the trench and via, reduces the interconnect performance in the completed integrated circuit device.

Several prior art approaches disclose methods to form dual damascene structures in the fabrication of integrated circuits. U.S. Pat. No. 6,040,243 to Li et al discloses a method to form dual damascene interconnects. Via and connective line trenches are filled in one copper deposition step. Barrier layer sidewall spacers on the trenches are used to prevent copper diffusion into the dielectric material during etching. U.S. Pat. No. 5,741,626 to Jain et al teaches a method to form dual damascene interconnects using tantalum nitride layers. Via and connective line trenches are filled in one copper deposition step. U.S. Pat. No. 5,981,374 to Dalal et al discloses a multi-level interconnect structure where adjoining insulating layers comprise differing material types to eliminate metal spiking. U.S. Pat. No. 5,933,761 to Lee teaches a method to form dual damascene structures. Nitrogen is implanted into the dielectric layer to create a buried etch stop layer. U.S. Pat. No. 5,930,669 to Uzoh discloses a method to form damascene interconnect structures. A trench liner layer is sputter deposited so that copper is left exposed at the trench bottom. After filling the trench with copper, an anneal is performed to crystallize adjoining copper layers and thereby improve conductivity.

SUMMARY OF THE INVENTION

A principal object of the present invention is to provide an effective and very manufacturable method of forming dual damascene copper interconnects in the manufacture of an integrated circuit device.

A further object of the present invention is to provide a method to fabricate dual damascene copper interconnects where the connective line and via trenches are filled in separate copper depositions to thereby improve performance.

Another further object of the present invention is to remove all unnecessary capping layers to thereby reduce the inter-layer capacitance.

Another further object of the present invention is to provide a method to fabricate dual damascene copper interconnects wherein the silicon nitride etch stop layer is eliminated to thereby reduce interconnect capacitance.

Another further object of the present invention is to provide a method of forming dual damascene interconnects whereby the first copper layer of the vias can be used as a seed layer for the subsequent deposition of a second copper layer into the upper interconnect trenches.

Another further object of the present invention is to provide a method to fabricate a robust copper line and via structure that is compatible with current electroless plating and electroplating processes and future deposition technologies.

In accordance with the objects of this invention, a method to form robust dual damascene interconnects by de-coupling via and connective line trench filling in the manufacture of an integrated circuit device has been achieved. A conductive layer is provided overlying a semiconductor substrate. A silicon nitride layer is deposited overlying the conductive layer. A first dielectric layer is deposited overlying the conductive layer. A shielding layer is deposited overlying the first dielectric layer. The shielding layer, the first dielectric layer, and the silicon nitride layer are patterned to form via trenches that expose a part of the conductive layer. A first barrier layer is deposited overlying the conductive layer and lining the via trenches. The via trenches are filled with a first copper layer. This filling may comprise a single deposition of copper or a first deposition of a seed layer followed by electroless or electrochemical plating of the first copper layer. The first copper layer and the first barrier layer are polished down to complete the vias. A second barrier layer is deposited overlying the first dielectric layer and the vias. The second barrier layer is patterned to form via caps overlying the vias. Alternatively, the first copper layer may be recessed below the top of the via trenches. The second barrier layer is deposited and then polished down to form via caps. A second dielectric layer is deposited overlying the via caps and the first dielectric layer. A capping layer is deposited overlying the second dielectric layer. The capping layer and the second dielectric layer are patterned to form connective line trenches that expose a part of the via caps. A third barrier layer is deposited overlying the via caps and lining the connective line trenches. The third barrier layer and the via caps are anisotropically etched down to form barrier sidewall spacers lining the connective line trenches and to expose a part of the first copper layer. The connective line trenches are filled with a second copper layer. This filling may comprise a single deposition of copper, a first deposition of a seed layer followed by electroless or electrochemical plating of copper, or by electroless or electrochemical plating of copper using the first copper layer as the seed layer. The second copper layer is polished down to complete the connective lines for the dual damascene interconnects in the manufacture of the integrated circuit device.

Also in accordance with the objects of this invention, a method to form robust dual damascene interconnects by de-coupling via and connective line trench filling in the manufacture of an integrated circuit device has been achieved. A conductive layer is provided overlying a semiconductor substrate. A first silicon nitride layer is deposited overlying the conductive layer. A first dielectric layer is deposited overlying the first silicon nitride layer. A second silicon nitride layer is deposited overlying the first dielectric layer. The second silicon nitride layer, the first dielectric layer, and the first silicon nitride layer are patterned to form via trenches that expose a part of the conductive layer. A first barrier layer is deposited overlying the conductive layer and lining the via trenches. The via trenches are filled with a first copper layer. This filling may comprise a single deposition of copper or a deposition of a seed layer followed by electrochemical plating or electroless plating of copper. The first copper layer and the first barrier layer are polished down to complete the vias. A third silicon nitride layer is deposited overlying the second silicon nitride layer and the vias. A second dielectric layer is deposited overlying the third silicon nitride layer. A fourth silicon nitride layer. is deposited overlying the second dielectric layer. The fourth silicon nitride layer and the second dielectric layer are patterned to form connective line trenches overlying the vias. A second barrier layer is deposited overlying the fourth silicon nitride layer and the third silicon nitride layer and lining the connective line trenches. The second barrier layer, the fourth silicon nitride layer, and the third silicon nitride layer are anisotropically etched down to form barrier layer sidewall spacers lining the connective line trenches and to expose a part of the first copper layer. The connective line trenches are filled with a second copper layer. This filling may comprise a single deposition of copper, a first deposition of a seed layer followed by electrochemical plating or electroless plating of copper, or electrochemical plating or electroless plating of copper using the first copper layer as a seed layer. The second copper layer is polished down to complete the connective lines for the dual damascene interconnects in the manufacture of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 15:
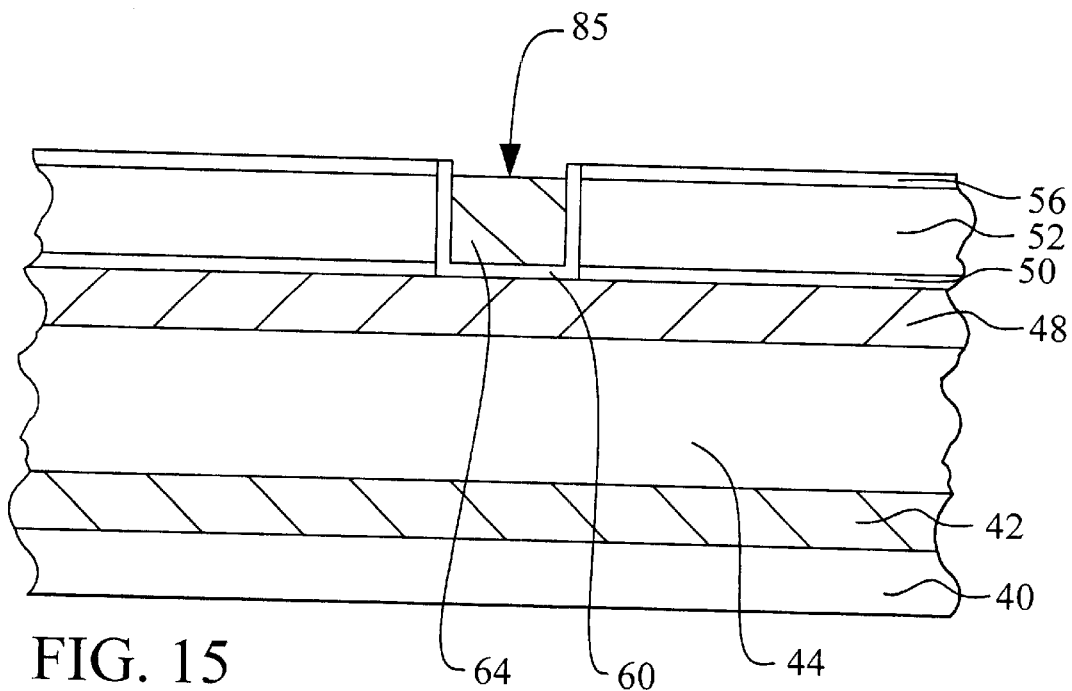
FIGS. 15 through 17 schematically illustrate the recessed capping option of the first preferred embodiment.
Figure 16:
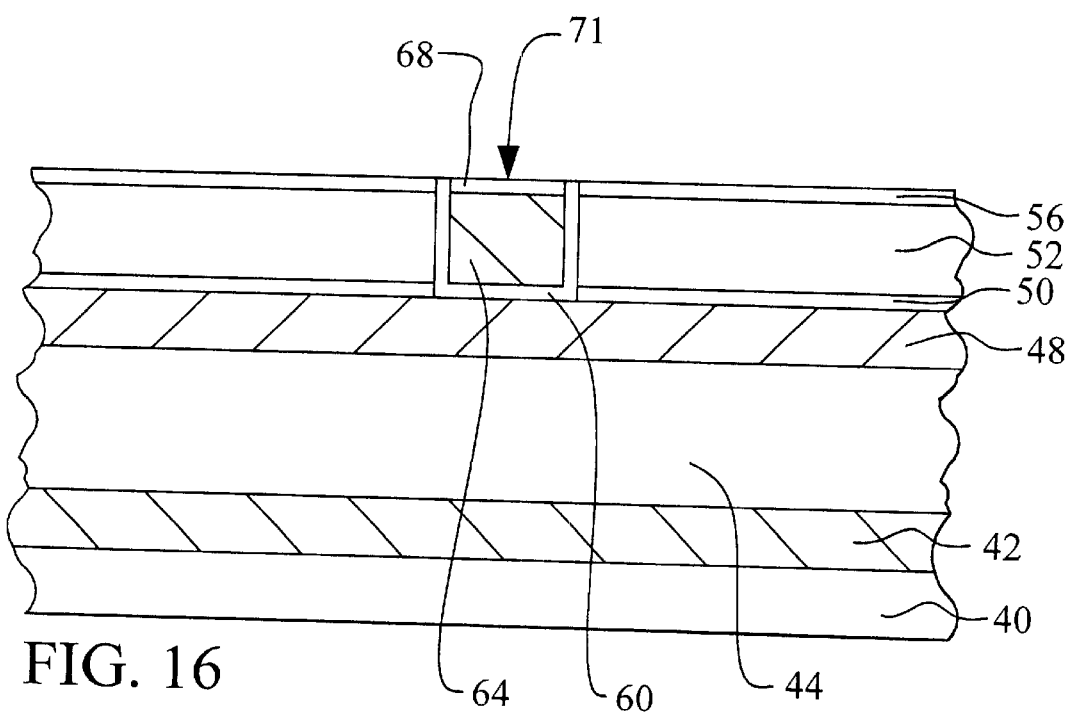
Figure 17:
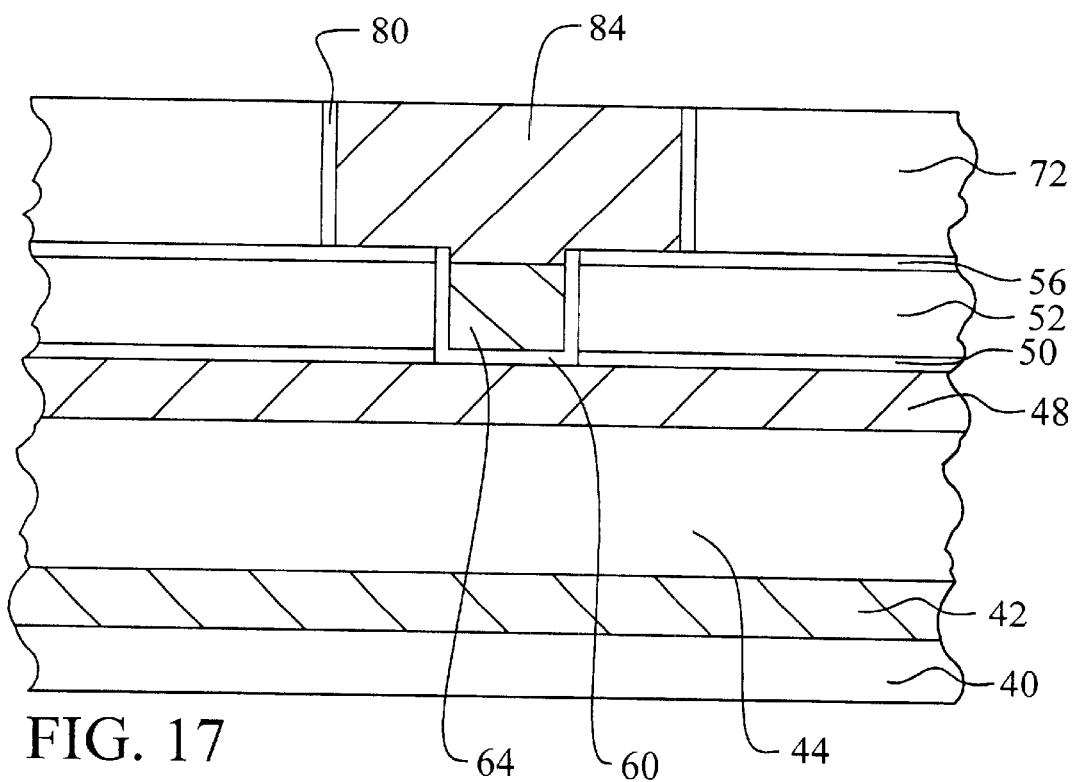

The embodiments disclose the application of the present invention to the formation of copper dual damascene interconnects. It should be clear to those experienced in the art that the present invention can be applied and extended without deviating from the scope of the present invention. FIGS. 4 through 14 illustrate a first preferred embodiment of the invention wherein a barrier layer cap is formed overlying the via level copper. FIGS. 15 through 17 illustrate a recessed capping version of the first preferred embodiment. FIGS. 15 through 20 illustrate a second preferred embodiment wherein silicon nitride encapsulates the copper via.

Figure 1:
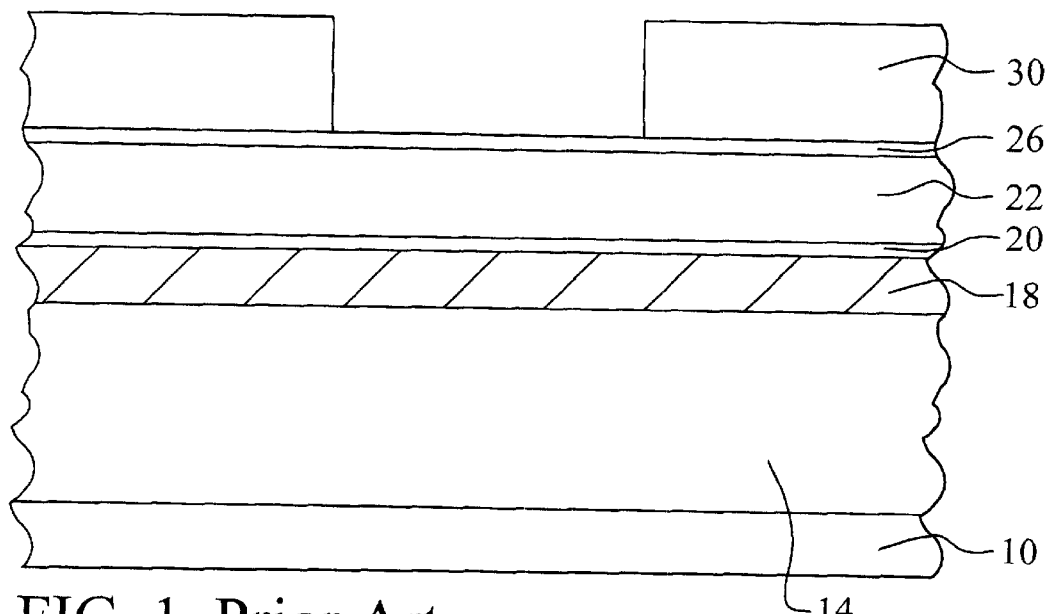
FIGS. 1 through 3 schematically illustrate in cross-section a partially completed prior art dual damascene interconnect in an integrated circuit device.
Figure 2:
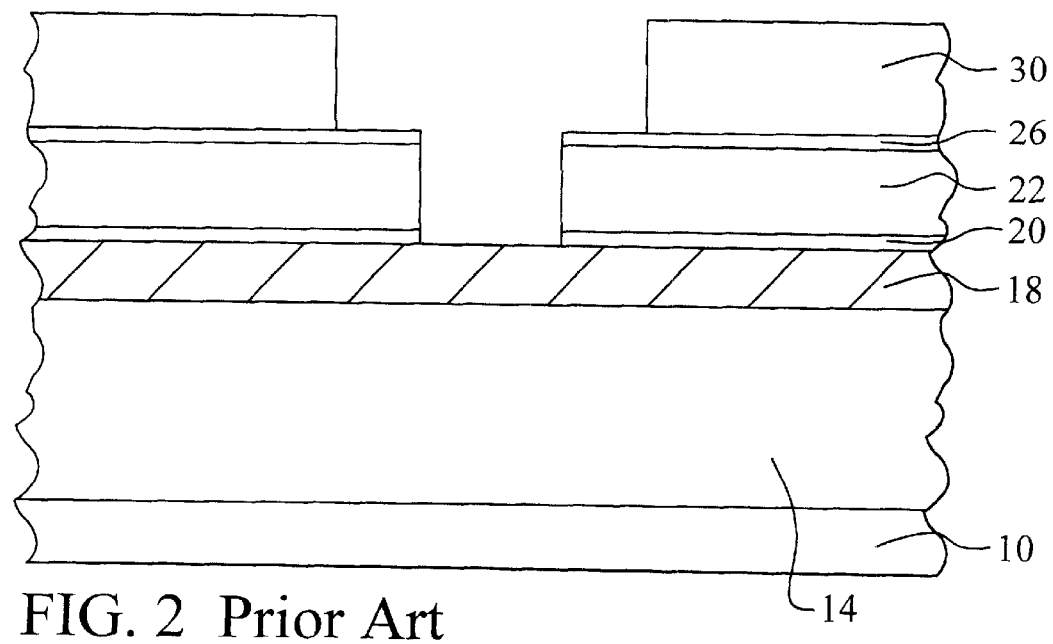
Figure 3:
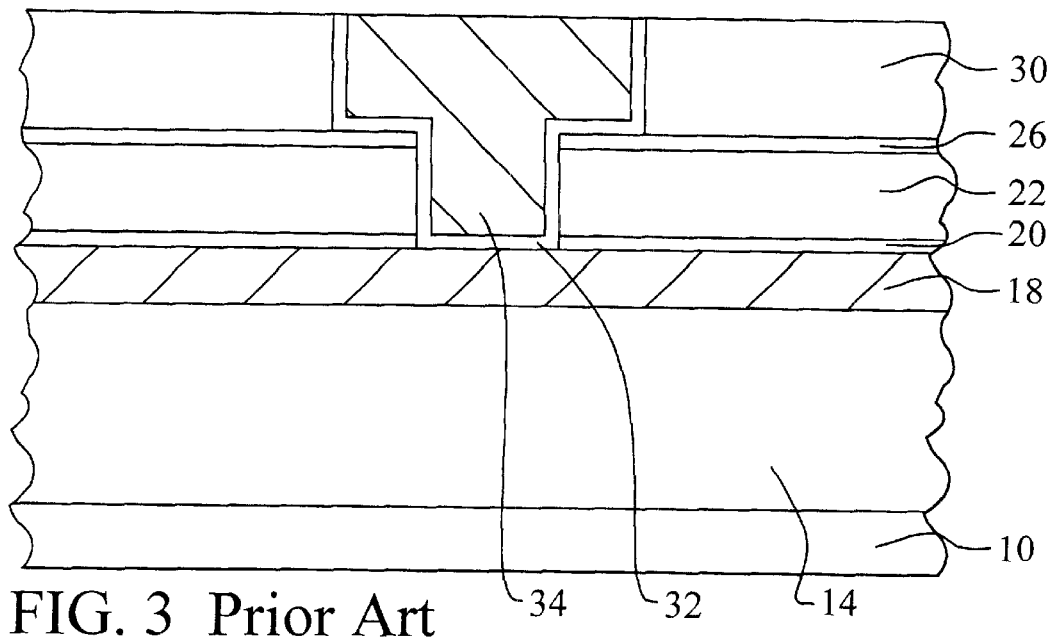
Figure 4:
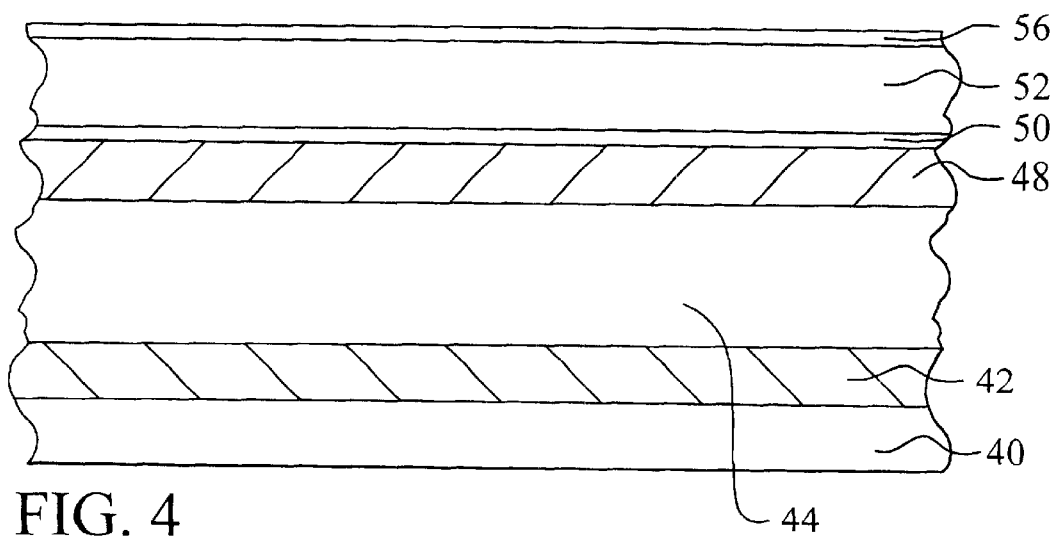
FIGS. 4 through 14 schematically illustrate in cross-sectional representation a first preferred embodiment of the present invention.

Referring now more particularly to FIG. 4, there is illustrated a cross section of a partially completed integrated circuit device of the first preferred embodiment. A semiconductor substrate 40 preferably comprises monocrystalline silicon. In practice, the semiconductor substrate 40 may additionally comprise insulating layers, conductive layers, and devices. A lowest conductor layer 42 may optionally overlie the semiconductor substrate 40. An insulating layer 44 is provided overlying the semiconductor substrate 40 or the lowest conductor layer 42, if used. A conductive layer 48 is provided overlying the insulating layer 44. The conductive layer 48 may comprise any metal or polysilicon material. Preferably, the conductive layer 48 comprises copper.

As an important feature of the present invention, a silicon nitride layer 50 is deposit ed overlying the conductive layer 48. The silicon nitride layer 50 prevents plasma-induced damage to the conductive layer 48 during the subsequent deposition of the first dielectric layer 52. A first dielectric layer 52 is deposited overlying the silicon nitride layer 50. The first dielectric layer 52 serves as an insulator between the conductive layer 48 and the subsequently formed level of connective lines. Significantly, with the introduction of better chemical mechanical polishing (CMP) equipment and methodology, and the insertion of dummy features in the integrated circuit device, the silicon nitride layer 50 and the first dielectric layer 52 may be deposited overlying a very planar conductive layer 48. This is important because it minimizes thickness variation in the first dielectric layer 52. Therefore, the via trenches formed in the first dielectric layer 52 can be of nearly equal height and volume. The first dielectric layer 52 preferably comprises a low dielectric constant material such as fluorosilicate glass (FSG), borophosphite silicate glass (BPSG), phosphosilicate glass (PSG), hydrogen silsesquioxane (HSQ), MSQ, or a product such as Flare, SILK, and Black Diamond. The first dielectric layer 52 is deposited to a thickness of between about 7,000 Angstroms and 9,000 Angstroms.

A shielding layer 56 is deposited overlying the first dielectric layer 52. The shielding layer 56 serves several purposes in this preferred embodiment of the present invention. First, the shielding layer 56 acts as an etching stop during the subsequent etching of the first and second barrier layers. Second, the shielding layer 56 protects the first dielectric layer 52 from copper diffusion, especially during the polish down of the first copper layer and the anisotropic etch for the connective line trenches. The shielding layer 56 preferably comprises tantalum nitride. Other materials that can be used for the shielding layer 56 include titanium nitride, titanium, titanium-tungsten-nitride, and composite tantalum nitride consisting of both crystalline and amorphous tantalum nitride. The shielding layer 56 is deposited to a thickness of between about 150 Angstroms and 300 Angstroms.

Figure 5:
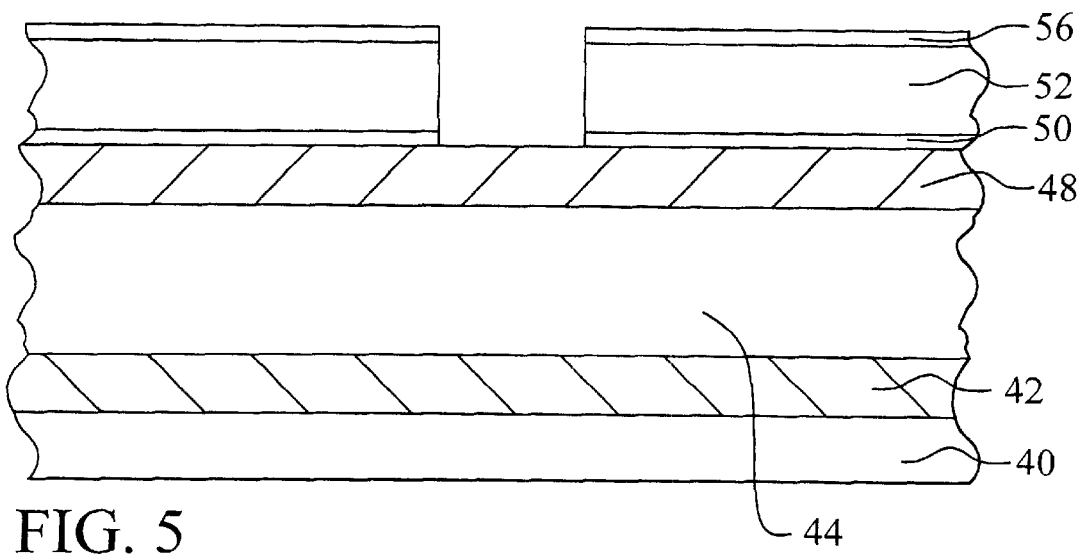

Referring now to FIG. 5, the shielding layer 56, the first dielectric layer 52, and the silicon nitride layer 50 are patterned to form the lower or via trenches. The patterning may be performed using a conventional photolithographic process where a photoresist layer (not shown) is applied, exposed, and developed. The remaining photoresist forms a mask for etching the shielding layer 56, the first dielectric layer 52, and silicon nitride layer 50. After the etching process, the photoresist is stripped away. The shielding layer 56, the first dielectric layer 52, and the silicon nitride layer 50 are preferably etched using a plasma-assisted dry etch. The shielding layer 56 is etched using a chemistry of, for example, $SF_6$ and Ar or $NF_3$ and Ar. The first dielectric layer 52 is etched using a chemistry of, for example, $C_4F_8$, CO, $O_2$, and Ar.

Figure 6:
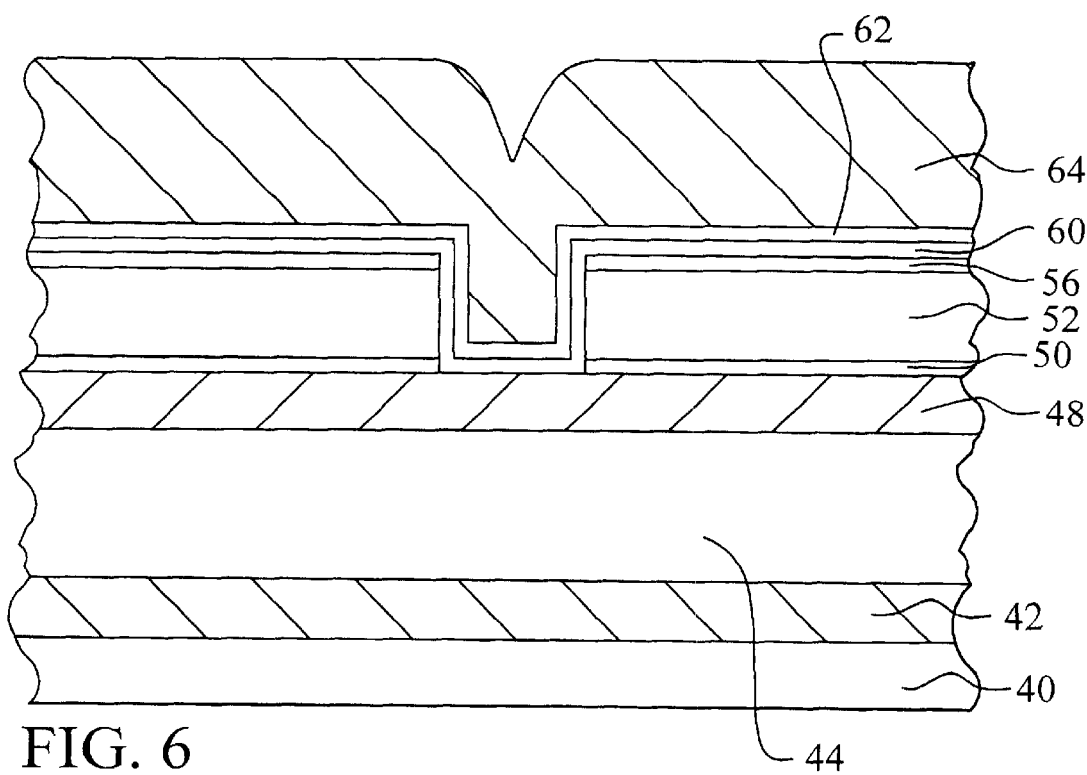

Referring now to FIG. 6, several important features of the present invention are illustrated. A first barrier layer 60 is deposited overlying the shielding layer 56 and lining the trenches. The first barrier layer 60 serves two purposes in the present invention. First, the first barrier layer 60 acts as a diffusion barrier to prevent the subsequently deposited copper from diffusing into the first dielectric layer 52. Second, the first barrier layer 60 provides a conductive contact between the underlying conductive layer 48 and the copper of the vias. Third, the first barrier layer 60 protects the first dielectric layer 52 from mobile copper ion attack. The first barrier layer 60 preferably comprises tantalum nitride. However, other materials that may be used for the first barrier layer 60 include titanium nitride, titanium, titanium-tungsten-nitride, and composite tantalum nitride consisting of both crystalline and amorphous tantalum nitride. The first barrier layer 60 is deposited by CVD to a thickness of between about 150 Angstroms and 300 Angstroms.

The via trenches are then filled with the first copper layer 64. This filling step may comprise either a two-step method or a single step method. In the two-step method, a first seed layer 62 is deposited and then the first copper layer 64 is plated using either electrochemical plating or electroless plating. The purpose of the first seed layer 62 is to provide a seed of copper atoms to facilitate the electroless plating or electrochemical plating deposition of the first copper layer 64. The seed layer 62 is deposited by either physical vapor deposition (PVD) or chemical vapor deposition (CVD) to a thickness of between about 200 Angstroms and 300 Angstroms. The first copper layer 64 is then plating using either electroless plating or electrochemical plating. The first copper layer 64 is preferably deposited to a thickness of between about 2,000 Angstroms and 4,000 Angstroms so that the via trenches are completely filled. Note that the novel method of the present invention allows different copper deposition processes to be used for the vias and for the connective lines. This facilitates the use of copper processes optimized to the aspect ratio of each trench.

The first copper layer 64 may also be deposited using a single-step chemical vapor deposition (CVD) process. This process would not necessarily require the presence of the first seed layer 62 to initiate deposition.

Figure 7:
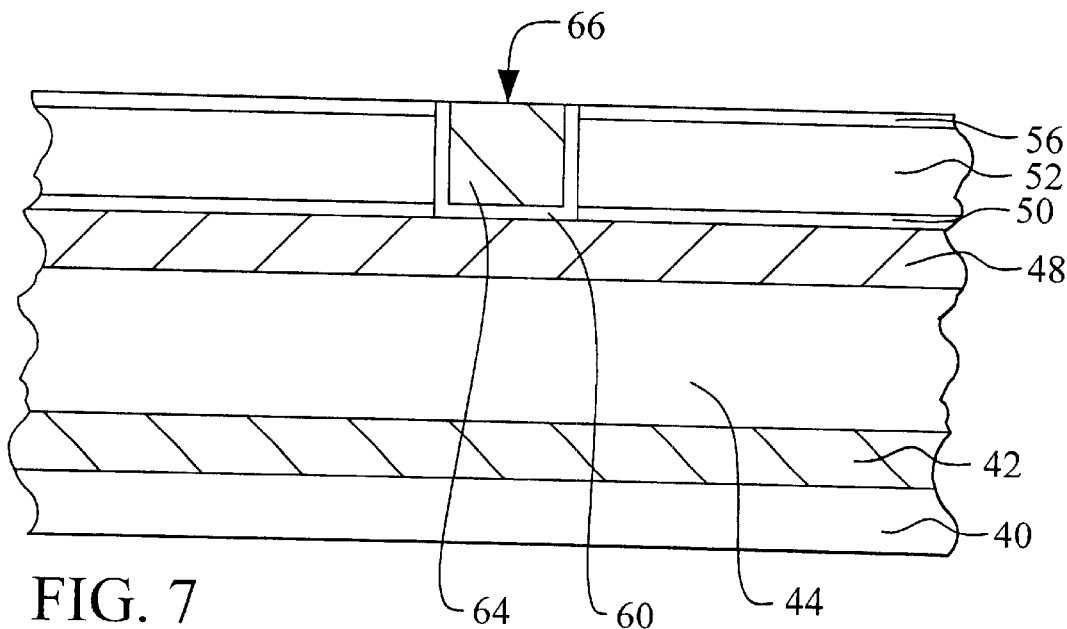

Referring now to FIG. 7, the first copper layer 64 and the first barrier layer 60 are polished down to complete the vias 66. All of the excess first copper layer 64 and first barrier layer 60 are removed so that all of the material is confined to the vias 66. The polishing step is performed using a conventional chemical mechanical polish (CMP) process or by a slurryless CMP process using a fixed abrasive pad.

Figure 8:
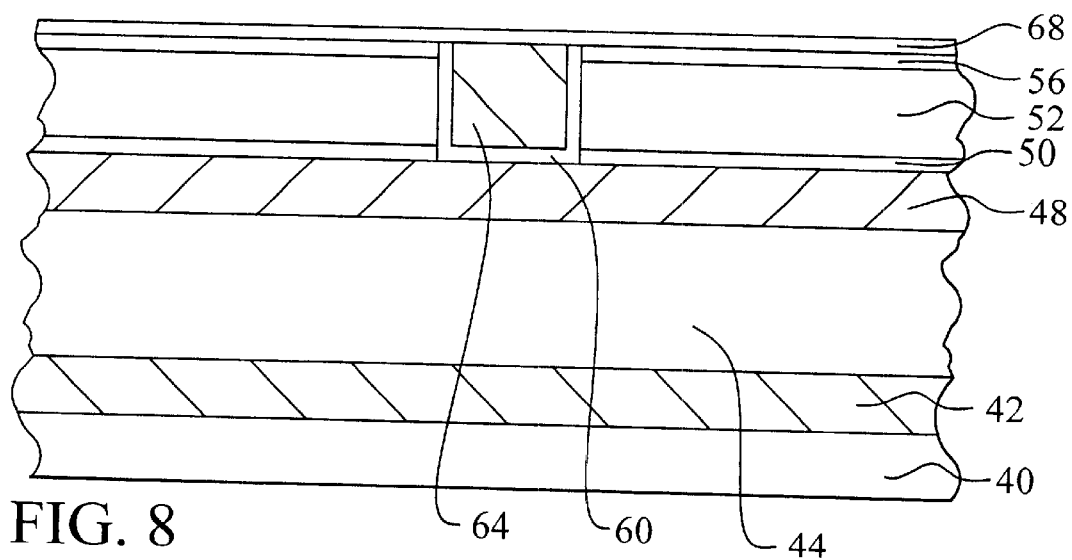

Referring now to FIG. 8, an important feature of the present invention is illustrated. A second barrier layer 68 is deposited overlying the shielding layer 56 and the vias 66. The second barrier layer 68 encapsulates the via at this point in the method. The second barrier layer 68 preferably comprises tantalum nitride. Other materials that may be used for the second barrier layer 60 include titanium nitride, titanium, titanium-tungsten-nitride, and composite tantalum nitride consisting of both crystalline and amorphous tantalum nitride. The second barrier layer 68 is deposited by CVD to a thickness of between about 150 Angstroms and 300 Angstroms.

Figure 9:
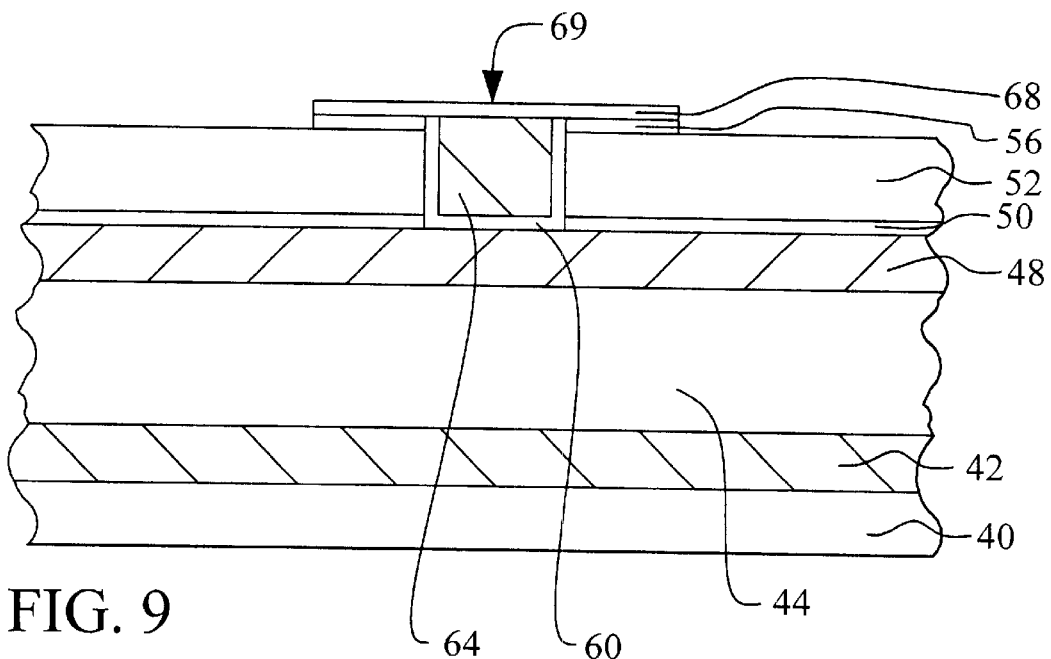

Referring now to FIG. 9, an important feature of the present invention is illustrated. The second barrier layer 68 and the shielding layer 56 are patterned to form via caps 69 overlying the vias. The via caps 69 serve several purposes. First, the presence of the via caps 69 prevents copper out-diffusion or up-diffusion from the first copper layer 64. Second, the via caps 69 provide an etching stop for the connective line trench etch. Finally, by limiting the surface area of the via caps 69 to only that required to cover the vias, parasitic capacitance from the second barrier layer 68 is minimized. This final point is particularly true for intra-layer and inter-layer capacitance where thinner dielectric layers are used or the pitch is tight. Referring again to the prior art case, the etch stop layer remains conformally overlying all of the dielectric layer. Therefore, the parasitic capacitance in the prior art is quite high. In the present invention, however, the parasitic capacitance due to the via caps 69 is small.

The patterning of the second barrier layer 68 and the shielding layer 56 may be performed using a conventional photolithography and etch sequence. For example, a photoresist layer (not shown) is coated overlying the second barrier layer 68. The photoresist layer is exposed through a mask and developed to remove excess photoresist. The second barrier layer 68 and the tantalum nitride layer 56 are then etched down using, for example, a plasma-assisted dry etching process. The remaining photoresist is then stripped away.

Figure 10:
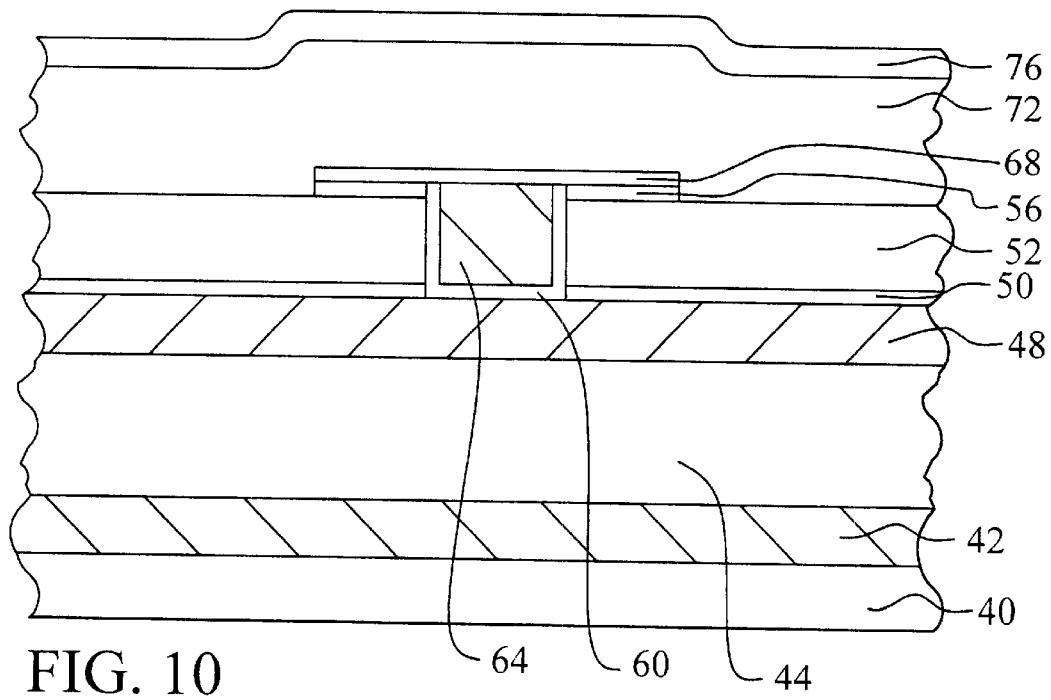

Referring now to FIG. 10, a second dielectric layer 72 is deposited overlying the first dielectric layer 52 and the via caps. The second dielectric layer 72 serves as an insulator between the adjacent connective lines. The second dielectric layer 72 preferably comprises a low dielectric constant material such as fluorosilicate glass (FSG), borophosphite silicate glass (BPSG), phosphosilicate glass (PSG), hydrogen silsesquioxane (HSQ), MSQ, or a product such as Flare, SiLK, and Black Diamond. The second dielectric layer 72 is deposited to a thickness of between about 7,000 Angstroms and 9,000 Angstroms.

A capping layer 76 is deposited overlying the second dielectric layer 72. The capping layer 76 prevents copper contamination of the top surface of the second dielectric layer 72 when the via caps are later etched through to expose the copper vias. The capping layer 76 preferably comprises tantalum nitride that is deposited by chemical vapor deposition (CVD). Other materials that may be used for the capping layer 76 include titanium nitride, titanium, titanium-tungsten-nitride, and composite tantalum nitride consisting of crystalline and amorphous tantalum nitride. The capping layer is deposited to a thickness of between about 150 Angstroms and 300 Angstroms.

Figure 11:
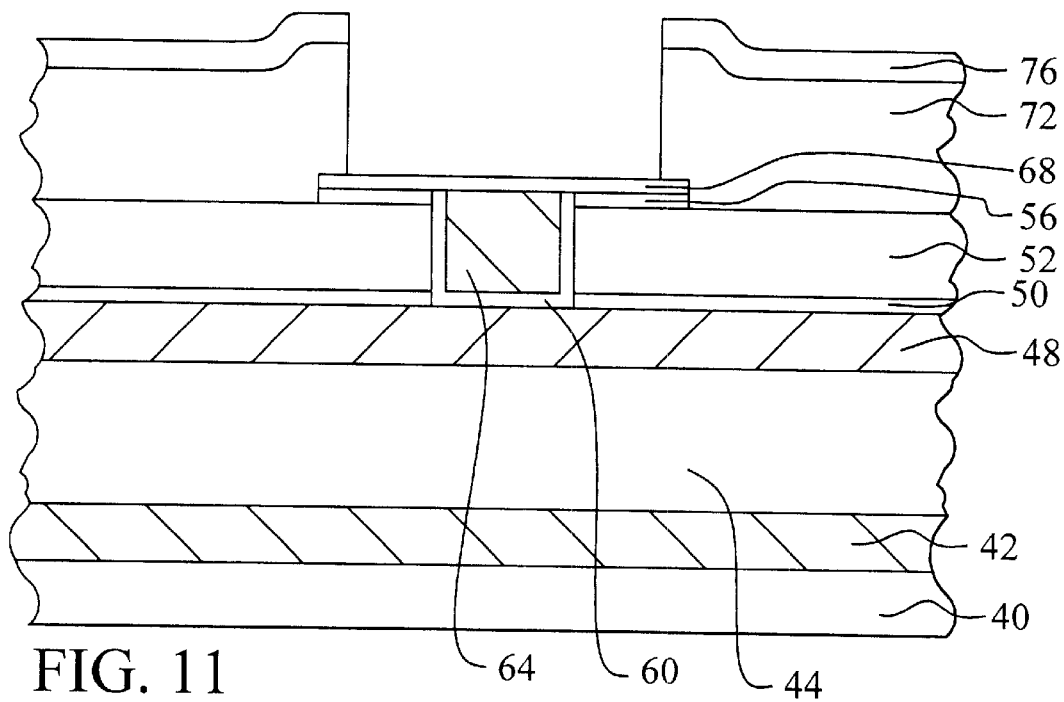

Referring now to FIG. 11, an important feature of the present invention is illustrated. The capping layer 76 and the second dielectric layer 72 are patterned to form the upper or connective line trenches overlying the vias 64. The patterning may be performed using a conventional photolithographic process where a photoresist layer (not shown) is applied, exposed, and developed. The remaining photoresist forms a mask for etching the capping layer 76 and the second dielectric layer 72. After the etching process, the photoresist is stripped away. The capping layer 76 is etched using a chemistry of, for example, $SF_6$ and Ar or $NF_3$ and Ar. The second dielectric layer 72 is etched using a chemistry of, for example, $C_4F_8$, CO, $O_2$, and Ar. Note that when etching the second dielectric layer 72 and clearing the second barrier layer 68, the etching chemistry must have a high etch selectivity and low substrate bias. This is to specifically avoid removal of any of the first copper layer 64 material. Copper mobile ions could be sputtered into the sidewalls of the second dielectric layer 72. The patterning forms connective line trenches that overlie the vias. The second barrier layer 68 acts as an etching stop to prevent exposure of the copper 64 of the vias.

Figure 12:
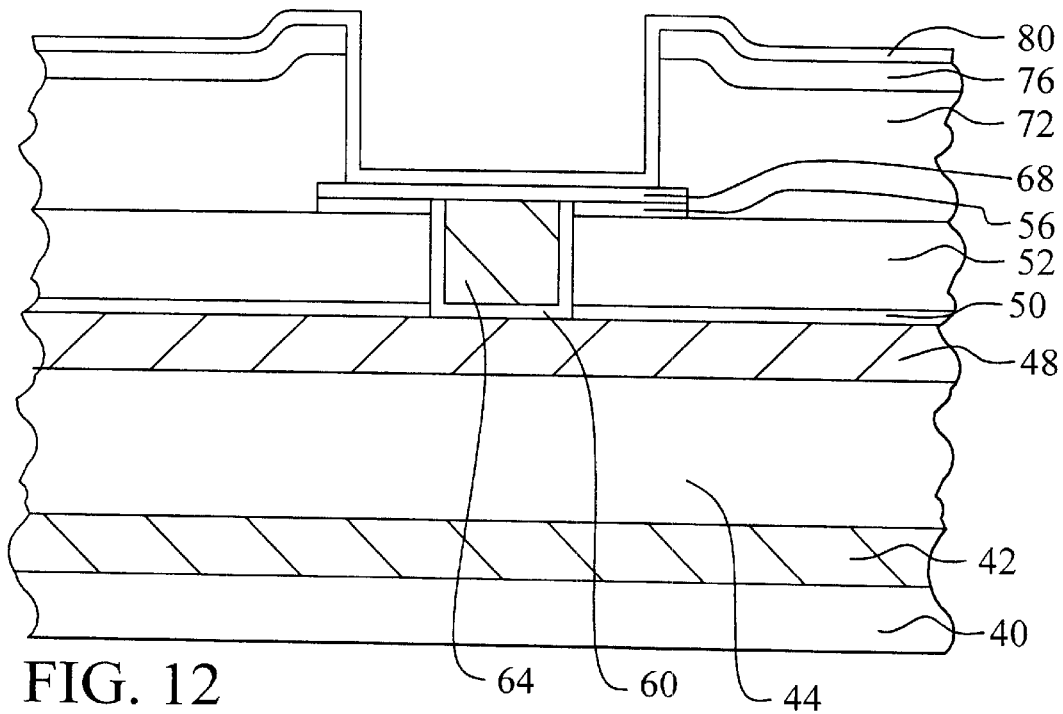

Referring now to FIG. 12, a third barrier layer 80 is deposited overlying the capping layer 76 and the via caps and lining the trenches. The third barrier layer 80 will form sidewall barriers for the connective line trenches. The third barrier layer 80 preferably comprises tantalum nitride. Other materials that may be used for the third barrier layer 80 include titanium nitride, titanium, titanium-tungsten-nitride, and composite tantalum nitride consisting of crystalline and amorphous tantalum nitride. The third barrier layer 80 is deposited to a thickness of between about 150 Angstroms and 300 Angstroms.

Figure 13:
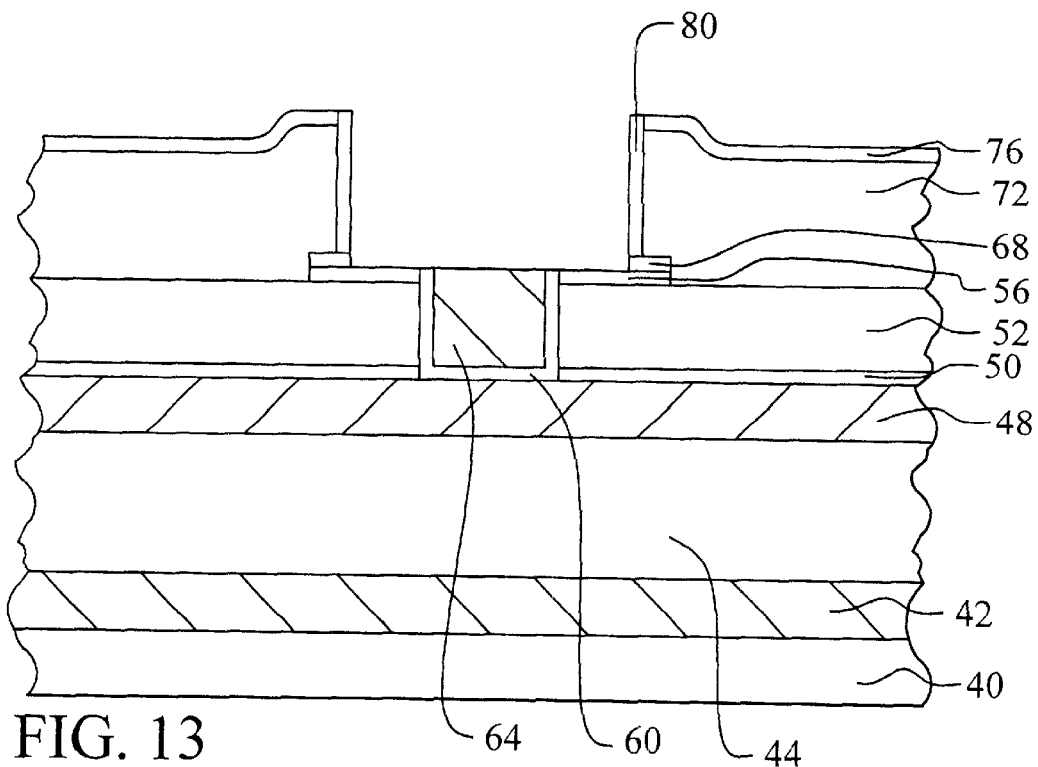

Referring now to FIG. 13, an important feature of the present invention is illustrated. The third barrier layer 80 and the via caps are anisotropically etched down to form barrier sidewall spacers 80 lining the connective line trenches and to expose a part of the first copper layer 64. Note that the presence of the third barrier layer 80 prevents copper diffusion into the second dielectric layer 72 during the breakthrough of the via caps. Note also that the presence of the capping layer 76, that is partially consumed during the etch, also prevents copper contamination of the second dielectric layer 72. The anisotropic etching step is preferably performed using a plasma-assisted dry etch. The capping layer 76 is etched using a chemistry of, for example, $SF_6$ and Ar or $NF_3$ and Ar. The second dielectric layer 72 is etched using a chemistry of, for example, $C_4F_8$, CO, $O_2$, and Ar. The resulting barrier sidewall spacers 80 are formed to a thickness of between about 150 Angstroms and 300 Angstroms.

Figure 14:
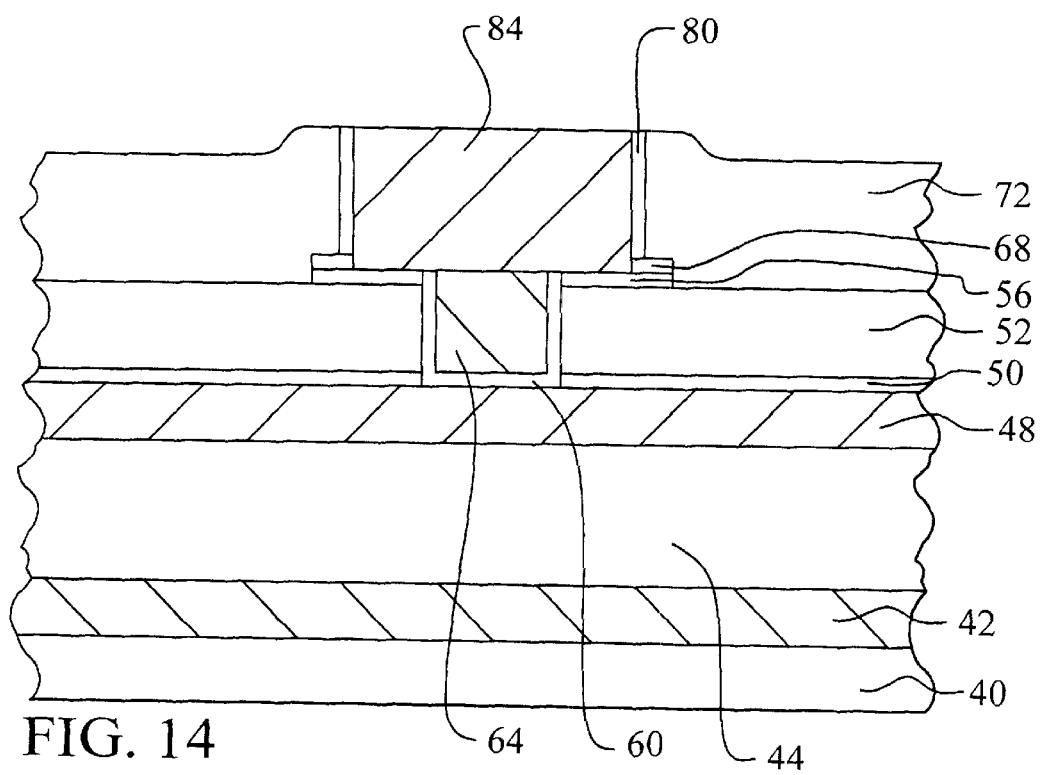

Referring now to FIG. 14, the connective line trenches are filled with a second copper layer 84. This filling step may be accomplished in any of three ways. First, The exposed first copper layer 64 can be used as a seed layer for electrochemical plating (ECP), electroless plating, CVD or PVD of the second copper layer 84. This is a significant feature of the present invention because it is not necessary to deposit an additional seed layer. Second, the second copper layer 84 may be deposited using a CVD process that does not require a seed layer. Third, a seed layer (not shown) may be deposited overlying the first copper layer 64. The second copper layer 84 can then be deposited by either electrochemical plating, electroless plating, CVD, or PVD. In the third option, the seed layer may comprise, for example, palladium acetate that is deposited by either CVD or PVD.

Importantly, the method used for filling the connective line trenches with the second copper layer 84 can be optimized to the aspect ratio of the connective line trenches. Further, the second copper layer 84 deposition process is independent of the process used for depositing the first copper layer 64. Each copper layer may be optimized to improve the overall performance of the circuit.

The second copper layer 84 is deposited to a thickness of between about 10,000 Angstroms and 12,000 Angstroms to completely fill the connective line trenches. The second copper layer 84 is then polished down to complete the connective lines of the dual damascene interconnects in the manufacture of the integrated circuit device. The polishing down step is performed using a conventional chemical mechanical polish (CMP) or slurryless CMP using a one step or two step process.

Note that the final dual damascene structure exhibits reduced parasitic capacitance compared to the prior art structure because the silicon nitride etch stopping layer has been eliminated. In addition, the via and connective line trench levels have been filled with copper using separate copper deposition steps. Each copper deposition can therefore be optimized to fill the particular aspect ratio trench of each level. In this way the performance of the copper conductors can be improved. The method of the present invention provides versatility because different copper deposition methods can be used for the connective lines and for the vias.

Referring now to FIGS. 15 through 17, an optional via cap method is illustrated. Referring particularly to FIG. 15, the method of the first preferred embodiment is performed up to and including the polishing down of the first copper layer 64 to complete the vias. This is illustrated in previously referenced FIG. 7. In this option, however, the first copper layer 84 is further recessed 85 below the edges of the via trenches. This may be accomplished, for example, by over polishing the copper.

Referring now to FIG. 16, the second barrier layer 68 is deposited overlying the shielding layer 56 and the vias 66. The second barrier layer 68 encapsulates the via at this point in the method. The second barrier layer 68 again preferably comprises tantalum nitride. Other materials that may be used for the second barrier layer 60 include titanium nitride, titanium, titanium-tungsten-nitride, and composite tantalum nitride consisting of both crystalline and amorphous tantalum nitride. The second barrier layer 68 is then polished down to the edges of the via trenches. All excess second barrier layer 68 is removed and via caps 71 are thereby formed. The advantages of the vias caps discussed in the first preferred embodiment above are present in these recessed via caps.

Referring now to FIG. 17, the remaining steps in the method of the first preferred embodiment are now performed to complete the dual damascene interconnect as shown.

Figure 18:
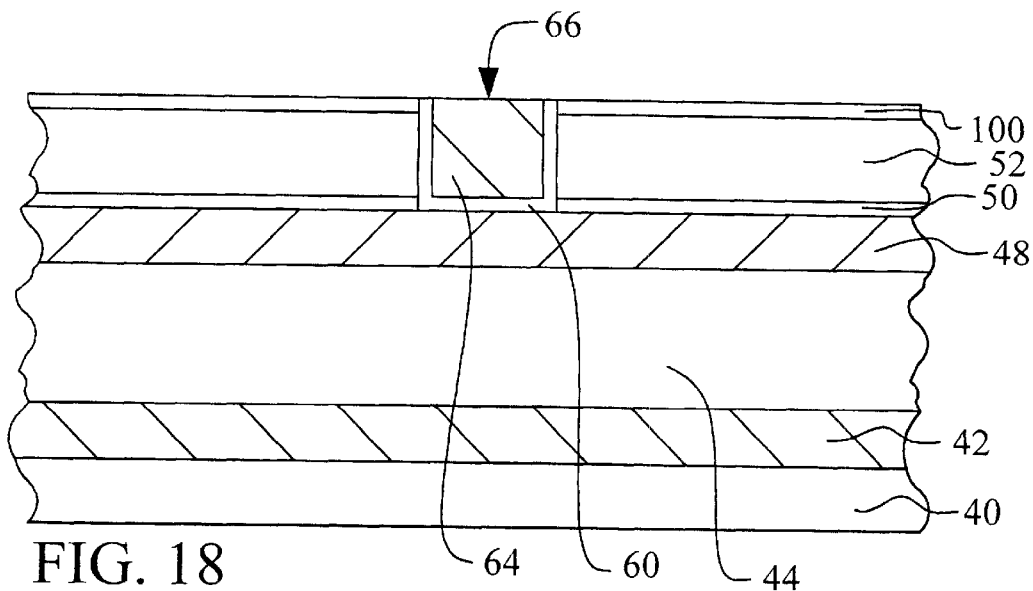
FIGS. 18 through 23 schematically illustrate in cross-sectional representation a second preferred embodiment of the present invention.

Referring now to FIG. 18, a second preferred embodiment of the present invention is presented. In the second preferred embodiment, silicon nitride is used for etch stopping. However, the via and connective line trenches are again filled in separate depositions. The method of the first preferred embodiment is followed through the polishing down step illustrated in FIG. 7 with two changes. In the second embodiment, the silicon nitride layer 50 is herein labeled the first silicon nitride layer 50. In addition, the shielding layer 56 is replaced with a second silicon nitride layer 100. Silicon nitride is used rather than metallic barrier material of the shielding layer 56 since the second silicon nitride layer 100 will not be removed in the method sequence. Therefore, a non-conductive material must be used to prevent shorting. The second silicon nitride layer 100 is preferably formed by CVD deposition to a thickness of between about 200 Angstroms and 400 Angstroms.

Figure 19:
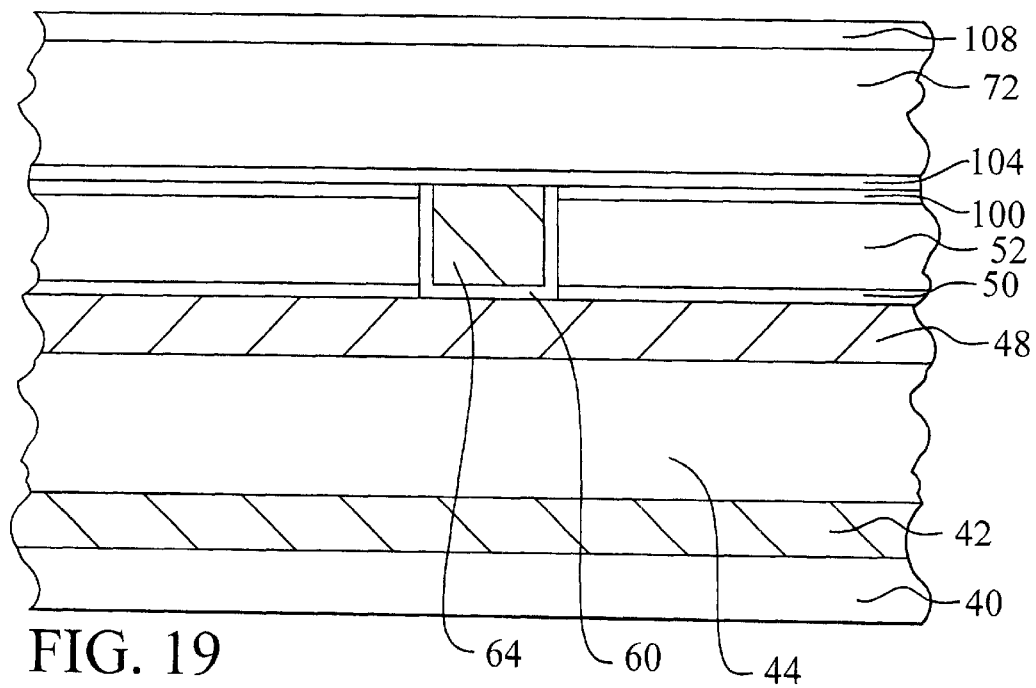

Referring now to FIG. 19, important features of the present invention are illustrated. A third silicon nitride layer 104 is deposited overlying the second silicon nitride layer 100 and the vias. The third silicon nitride layer 104 serves two purposes. First, the third silicon nitride layer 104 encapsulates the first copper layer 64 of the vias to prevent out diffusion. Second, the third silicon nitride layer 104 will serve as an etch stop during barrier sidewall spacer formation. Finally, the third silicon nitride layer 104 mitigates some plasma induced damage (PID) during deposition of the second dielectric layer 72. The third silicon nitride layer 104 is preferably deposited to a thickness of between about 200 Angstroms and 400 Angstroms.

A second dielectric layer 72 is deposited overlying the third silicon nitride layer 104. The second dielectric layer 72 serves as an insulator between the adjacent connective lines. The second dielectric layer 72 preferably comprises a low dielectric constant material such as fluorosilicate glass (FSG), borophosphate silicate glass (BPSG), phosphosilicate glass (PSG), hydrogen silsesquioxane (HSQ), MSQ, or product such as Flare, SiLK, and Black Diamond. The second dielectric layer 72 is deposited to a thickness of between about 7,000 Angstroms and 9,000 Angstroms.

A fourth silicon nitride layer 108 is deposited overlying the second dielectric layer 72. The fourth silicon nitride layer 108 prevents copper contamination of the top surface of the second dielectric layer 72 when the third silicon nitride layer 104 is later etched through to expose the copper vias. The fourth silicon nitride layer 108 may be deposited by chemical vapor deposition (CVD) to a thickness of between about 500 Angstroms and 800 Angstroms. Significantly, the fourth silicon nitride layer 108 is thicker than the previously deposited silicon nitride layers so that it is not completely etched away during the subsequent etch through of the third silicon nitride layer 104.

Figure 20:
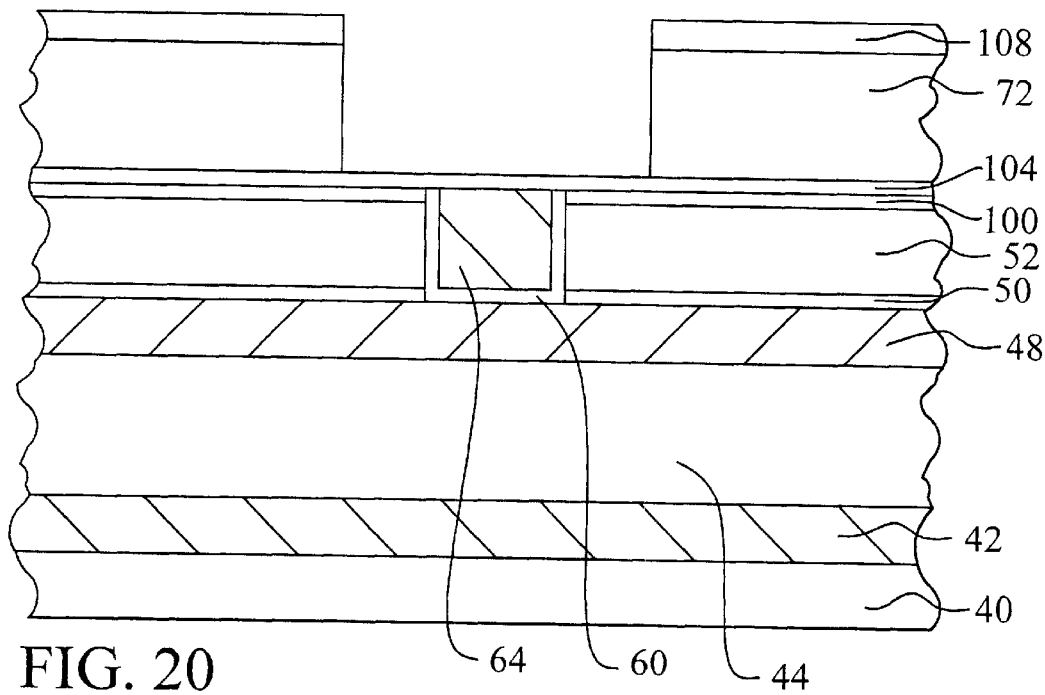

Referring now to FIG. 20, an important feature of the present invention is illustrated. The fourth silicon nitride layer 108 and the second dielectric layer 72 are patterned to form the upper or connective line trenches overlying the vias. The patterning may be performed using a conventional photolithographic process where a photoresist layer (not shown) is applied, exposed, and developed. The remaining photoresist forms a mask for etching the fourth silicon nitride layer 108 and the second dielectric layer 72. After the etching process, the photoresist is stripped away. The fourth silicon nitride layer 108 and the second dielectric layer 72 are preferably etched using a plasma-assisted dry etch. The fourth silicon nitride layer 108 is etched using a chemistry of, for example, $CH_2F_2$, $O_2$, and Ar or $NF_3$ and Ar. The second dielectric layer 72 is etched using a chemistry of, for example, $C_4F_8$, CO, $O_2$, and Ar. The patterning forms connective line trenches overlying the vias 64. The third silicon nitride layer 104 acts as an etching stop to prevent exposure of the copper 64 of the vias 64.

Figure 21:
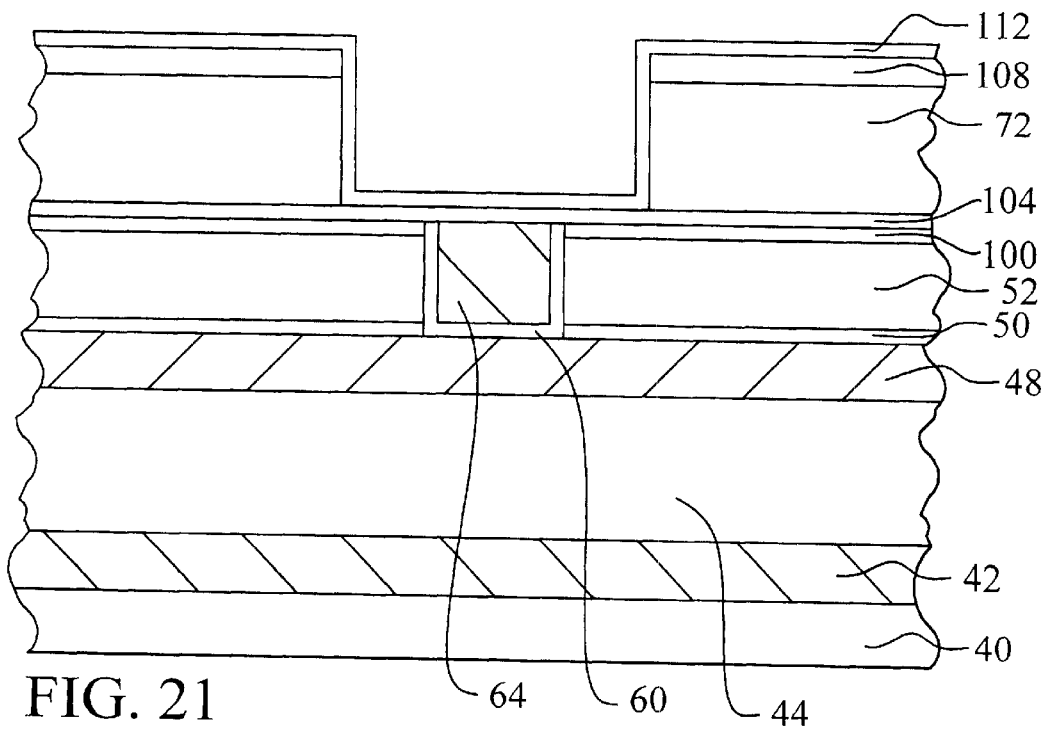

Referring now to FIG. 21, a second barrier layer 112 is deposited overlying the fourth silicon nitride layer 108 and the third silicon nitride layer 104, and lining the connective line trenches. The second barrier layer 112 will form sidewall barriers for the connective line trenches. The second barrier layer 112 preferably comprises tantalum nitride. Other materials that may be used for the second barrier layer 112 include titanium nitride, titanium, titanium-tungsten-nitride, and composite tantalum nitride consisting of crystalline and amorphous tantalum nitride. The second barrier layer 112 is deposited to a thickness of between about 150 Angstroms and 300 Angstroms.

Figure 22:
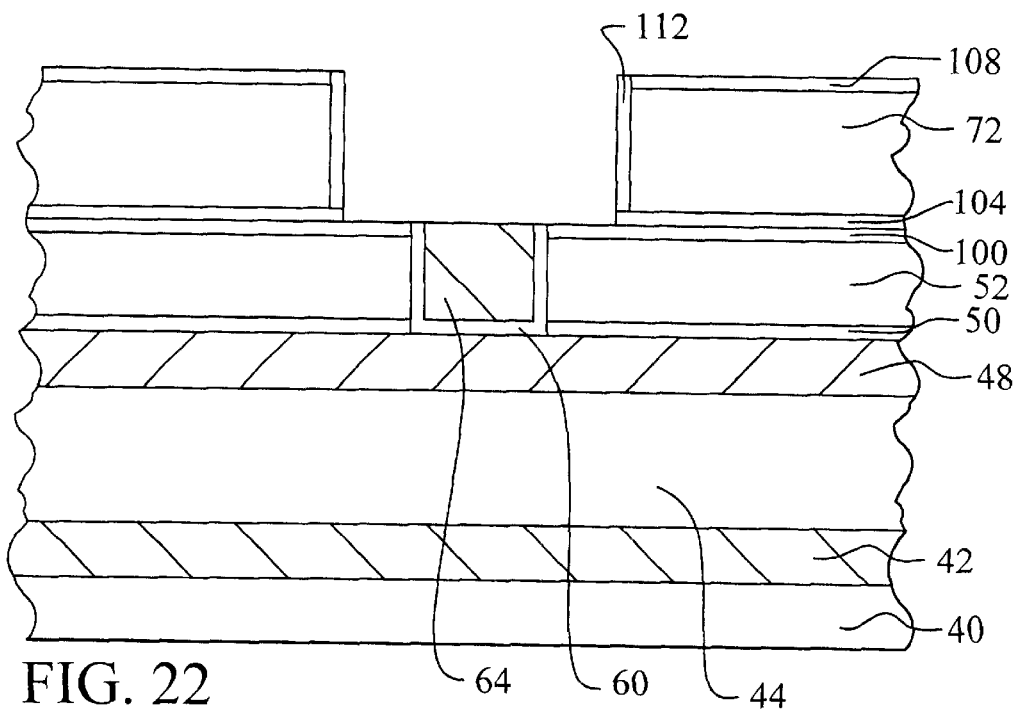

Referring now to FIG. 22, an important feature of the present invention is illustrated. The second barrier layer 112, the fourth silicon nitride layer 108 and the third silicon nitride layer 104 are anisotropically etched down. Barrier sidewall spacers 112 lining the connective line trenches are thus formed. The top surface of the first copper layer 64 is exposed. Note that the presence of the second barrier layer 112 on the sidewalls prevents copper diffusion into the second dielectric layer 72 during the breakthrough to the first copper layer 64. Note also that the presence of the thicker fourth silicon nitride layer 108, that is partially consumed during the etch, also prevents copper contamination of the second dielectric layer 72. Finally, the second silicon nitride layer 100 acts an etching stop during the anisotropic etch of the second barrier layer 112.

The anisotropic etching step is preferably performed using a plasma-assisted dry etch. The second barrier layer 112 is etched using a chemistry of, for example, $SF_6$ and Ar or $NF_3$ and Ar. The fourth silicon nitride layer 108 is etched using a chemistry of, for example, $CH_2F_2$, O2, and Ar or $NF_3$ and Ar. The resulting barrier sidewall spacers 112 are formed to a thickness of between about 150 Angstroms and 300 Angstroms.

Figure 23:
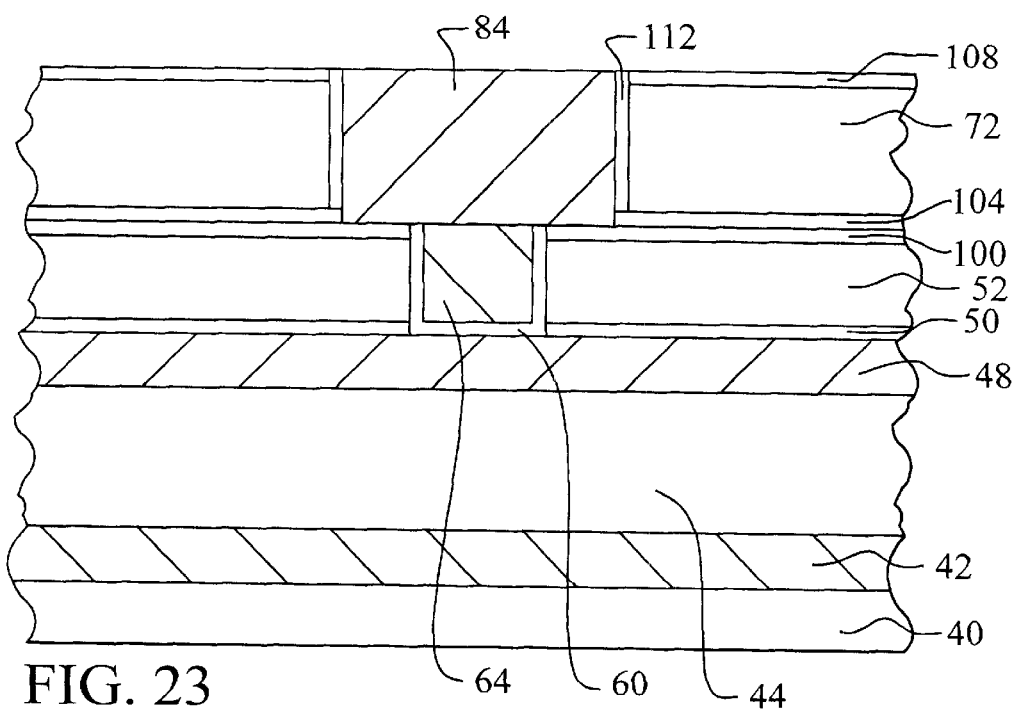

Referring now to FIG. 23, the connective line trenches are filled with a second copper layer 84. This filling step may be accomplished in any of three ways. First, The exposed first copper layer 64 can be used as a seed layer for electrochemical plating (ECP), electroless plating, CVD or PVD of the second copper layer 84. This is a significant feature of the present invention because it is not necessary to deposit an additional seed layer. Second, the second copper layer 84 may be deposited using a CVD process that does not require a seed layer. Third, a seed layer (not shown) may be deposited overlying the first copper layer 64. The second copper layer 84 can then be deposited by either electrochemical plating, electroless plating, CVD, or PVD. In the third option, the seed layer may comprise, for example, palladium acetate that is deposited by either CVD or PVD.

Importantly, the method used for filling the connective line trenches with the second copper layer 84 can be optimized to the aspect ratio of the connective line trenches. Further, the second copper layer 84 deposition process is independent of the process used for depositing the first copper layer 64. Each copper layer may be optimized to improve the overall performance of the circuit.

The second copper layer is deposited to a thickness of between about 10,000 Angstroms and 12,000 Angstroms to completely fill the connective line trenches. The second copper layer 84 is then polished down to complete the connective lines of the dual damascene interconnects in the manufacture of the integrated circuit device. The polishing down step is performed using a conventional chemical mechanical polish (CMP) or slurryless CMP using a one step or two step process.

Note that the via and connective line trenches of the dual damascene structure of the second preferred embodiment have been filled with copper using separate copper deposition steps. Each deposition can therefore be optimized to fill the particular aspect ratio trench of each level. Again, this is a unique advantage of the method of the present invention. Greater process flexibility, as well as copper conductor performance, is achieved.

As shown in the preferred embodiment, the present invention provides a very manufacturable method for fabricating dual damascene structures in the manufacture of integrated circuit devices. Parasitic capacitance may be reduced through the elimination of silicon nitride etch stops. Copper vias and connective lines are filled separately to improve fill charateristics and performance. The copper via can be used as a seed layer for the deposition of the connective lines by plating.

While the invention has been particularly shown and described with reference to the preferred embodiments thereof, it will be understood by those skilled in the art that various changes in form and details may be made without departing from the spirit and scope of the invention.

What is claimed is:

1. A method to form robust dual damascene interconnects by de-coupling via and connective line trench filling in the manufacture of an integrated circuit device comprising:

providing a conductive layer overlying a semiconductor substrate;

depositing a silicon nitride layer overlying said conductive layer;

depositing a first dielectric layer overlying said silicon nitride layer;

depositing a shielding layer overlying said first dielectric layer;

patterning said shielding layer, said first dielectric layer, and said silicon nitride layer to form via trenches that expose a part of said conductive layer;

depositing a first barrier layer overlying said conductive layer and lining said via trenches;

filling said via trenches with a first copper layer;

polishing down said first copper layer and said first barrier layer to complete vias;

depositing a second barrier layer overlying said vias and said first dielectric layer;

patterning said second barrier layer and said shielding layer to form via caps overlying said vias;

depositing a second dielectric layer overlying said via caps and said first dielectric layer;

depositing a capping layer overlying said second dielectric layer;

patterning said capping layer and said second dielectric layer to form connective line trenches that expose a part of said via caps;

depositing a third barrier layer overlying said capping and said via caps and lining said connective line trenches;

anisotropically etching down said third barrier layer and said via caps to form barrier sidewall spacers lining said connective line trenches and to expose a part of said first copper layer;

filling said connective line trenches with a second copper layer; and polishing down said second copper layer to complete connective lines for said dual damascene interconnects in the manufacture of said integrated circuit device.

2. The method according to claim 1 wherein first barrier layer, said second barrier layer, and said third barrier layer each comprise one of the group of: tantalum nitride, titanium nitride, titanium, titanium-tungsten-nitride, and composite tantalum nitride consisting of both crystalline and amorphous tantalum nitride.

3. The method according to claim 1 wherein said shielding layer comprises one of the group of: tantalum nitride, titanium nitride, titanium, titanium-tungsten-nitride, and composite tantalum nitride consisting of both crystalline and amorphous tantalum nitride.

4. The method according to claim 1 wherein said capping layer comprises one of the group of: tantalum nitride, titanium nitride, titanium, titanium-tungsten-nitride, and composite tantalum nitride consisting of both crystalline and amorphous tantalum nitride.

5. The method according to claim 1 wherein said steps of filling said via trenches with a first copper layer and filling said connective line trenches with a second copper layer comprise different methods.

6. The method according to claim 1 wherein said step of filling said via trenches with a first copper layer comprises depositing a seed layer by one of the group of: physical vapor deposition and chemical vapor deposition and thereafter plating said first copper layer by one of the group of: electrochemical plating and electroless plating.

7. The method according to claim 1 wherein said step of filling said via trenches with a first copper layer comprises depositing said first copper layer by chemical vapor deposition.

8. The method according to claim 1 wherein said step of filling said connective line trenches with a second copper layer comprises using said exposed part of said first copper layer as a seed layer and wherein said second copper layer is plated by one of the group of: electrochemical plating and electroless plating.

9. The method according to claim 1 wherein said step of filling said connective line trenches with a second copper layer comprises depositing a palladium acetate seed layer and thereafter plating said second copper layer wherein said plating by one of the group of: electrochemical plating and electroless plating.

10. The method according to claim 1 wherein said step of filling said connective line trenches with a second copper layer comprises depositing said second copper layer by chemical vapor deposition.

11. The method according to claim 1 wherein said step of filling said via trenches with a first copper layer comprises depositing a seed layer by one of the group of: physical vapor deposition and chemical vapor deposition and thereafter plating said first copper layer by one of the group of: electrochemical plating and electroless plating and wherein said step of filling said connective line trenches with a second copper layer comprises depositing said second copper layer by chemical vapor deposition.

12. The method according to claim 1 wherein said step of filling said via trenches with a first copper layer comprises depositing a first copper layer by chemical vapor deposition and wherein said step of filling said connective line trenches with a second copper layer comprises depositing a seed layer by one of the group of: physical vapor deposition and chemical vapor deposition and thereafter plating said second copper layer by one of the group of: electrochemical plating and electroless plating.

13. A method to form robust dual damascene interconnects by de-coupling via and connective line trench filling in the manufacture of an integrated circuit device comprising:

providing a conductive layer overlying a semiconductor substrate;

depositing a silicon nitride layer overlying said conductive layer;

depositing a first dielectric layer overlying said silicon nitride layer;

depositing a shielding layer overlying said first dielectric layer;

patterning said shielding layer, said first dielectric layer, and said silicon nitride layer to form via trenches that expose a part of said conductive layer;

depositing a first barrier layer overlying said conductive layer and lining said via trenches;

filling said via trenches with a first copper layer;

polishing down said first copper layer and said first barrier layer to complete vias;

recessing said first copper layer below the top edge of said via trenches;

depositing a second barrier layer overlying said vias and said first dielectric layer;

polishing down said second barrier layer to form via caps overlying said vias;

depositing a second dielectric layer overlying said via caps and said first dielectric layer;

depositing a capping layer overlying said second dielectric layer;

patterning said capping layer and said second dielectric layer to form connective line trenches that expose a part of said via caps;

depositing a third barrier layer overlying said capping and said via caps and lining said connective line trenches;

anisotropically etching down said third barrier layer and said via caps to form barrier sidewall spacers lining said connective line trenches and to expose a part of said first copper layer;

filling said connective line trenches with a second copper layer; and polishing down said second copper layer to complete connective lines for said dual damascene interconnects in the manufacture of said integrated circuit device.

14. The method according to claim 13 wherein said first barrier layer, said second barrier layer, and said third barrier layer each comprise one of the group of: tantalum nitride, titanium nitride, titanium, titanium-tungsten nitride, and composite tantalum nitride consisting of both crystalline and amorphous tantalum nitride.

15. The method according to claim 13 wherein said shielding layer comprises one of the group of: tantalum nitride, titanium nitride, titanium, titanium-tungsten-nitride, and composite tantalum nitride consisting of both crystalline and amorphous tantalum nitride.

16. The method according to claim 13 wherein said capping layer comprises one of the group of: tantalum nitride, titanium nitride, titanium, titanium-tungsten-nitride, and composite tantalum nitride consisting of both crystalline and amorphous tantalum nitride.

17. The method according to claim 13 wherein said steps of filling said via trenches with a first copper layer and filling said connective line trenches with a second copper layer comprise different methods.

18. The method according to claim 13 wherein said step of filling said via trenches with a first copper layer comprises depositing a seed layer by one of the group of: physical vapor deposition and chemical vapor deposition and thereafter plating said first copper layer by one of the group of: electrochemical plating and electroless plating.

19. The method according to claim 13 wherein said step of filling said via trenches with a first copper layer comprises depositing said first copper layer by chemical vapor deposition.

20. The method according to claim 13 wherein said step of filling said connective line trenches with a second copper layer comprises using said exposed part of said first copper layer as a seed layer and wherein said second copper layer is plated by one of the group of: electrochemical plating and electroless plating.

21. The method according to claim 13 wherein said step of filling said connective line trenches with a second copper layer comprises depositing a palladium acetate seed layer and thereafter plating said second copper layer wherein said plating by one of the group of: electrochemical plating and electroless plating.

22. The method according to claim 13 wherein said step of filling said connective line trenches with a second copper layer comprises depositing said second copper layer by chemical vapor deposition.

23. The method according to claim 13 wherein said step of filling said via trenches with a first copper layer comprises depositing a seed layer by one of the group of: physical vapor deposition and chemical vapor deposition and thereafter plating said first copper layer by one of the group of: electrochemical plating and electroless plating and wherein said step of filling said connective line trenches with a second copper layer comprises depositing said second copper layer by chemical vapor deposition.

24. The method according to claim 13 wherein said step of filling said via trenches with a first copper layer comprises depositing a first copper layer by chemical vapor deposition and wherein said step of filling said connective line trenches with a second copper layer comprises depositing a seed layer by one of the group of: physical vapor deposition and chemical vapor deposition and thereafter plating said second copper layer by one of the group of: electrochemical plating and electroless plating.

25. A method to form robust dual damascene interconnects by de-coupling via and connective line trench filling in the manufacture of an integrated circuit device comprising:

providing a conductive layer overlying a semiconductor substrate;

depositing a first dielectric layer overlying said conductive layer;

depositing a first silicon nitride layer overlying said first dielectric layer;

patterning said first dielectric layer and said first silicon nitride layer to form via trenches that expose a part of said conductive layer;

depositing a first barrier layer overlying said first silicon nitride layer and said conductive layer and lining said via trenches;

filling said via trenches with a first copper layer;

polishing down said first copper layer and said first barrier layer to complete vias;

depositing a second silicon nitride layer overlying said first silicon nitride layer and said vias;

depositing a second dielectric layer overlying said second silicon nitride layer;

depositing a third silicon nitride layer overlying said second dielectric layer;

patterning said third silicon nitride layer and said second dielectric layer to form connective line trenches overlying said vias;

depositing a second barrier layer overlying said third silicon nitride layer and said second silicon nitride layer and lining said connective line trenches;

anisotropically etching down said second barrier layer, said third silicon nitride layer, and said second silicon nitride layer to form barrier layer sidewall spacers lining said connective line trenches and to expose a part of said first copper layer;

filling said connective line trenches with a second copper layer; and polishing down said second copper layer to complete connective lines for said dual damascene interconnects in the manufacture of said integrated circuit device.

26. The method according to claim 25 wherein said steps of filling said via trenches with a first copper layer and filling said connective line trenches with a second copper layer comprise different methods.

27. The method according to claim 25 wherein said step of filling said via trenches with a first copper layer comprises depositing a seed layer by one of the group of: physical vapor deposition and chemical vapor deposition and thereafter plating said first copper layer by one of the group of: electrochemical plating and electroless plating.

28. The method according to claim 25 wherein said step of filling said via trenches with a first copper layer comprises depositing said first copper layer by chemical vapor deposition.

29. The method according to claim 25 wherein said step of filling said connective line trenches with a second copper layer comprises using said exposed part of said first copper layer as a seed layer and wherein said second copper layer is plated by one of the group of: electrochemical plating and electroless plating.

30. The method according to claim 25 wherein said step of filling said connective line trenches with a second copper layer comprises depositing a palladium acetate seed layer and thereafter plating said second copper layer wherein said plating by one of the group of: electrochemical plating and electroless plating.

31. The method according to claim 25 wherein said step of filling said connective line trenches with a second copper layer comprises depositing said second copper layer by chemical vapor deposition.

32. The method according to claim 25 wherein said step of filling said via trenches with a first copper layer comprises depositing a seed layer by one of the group of: physical vapor deposition and chemical vapor deposition and thereafter plating said first copper layer by one of the group of: electrochemical plating and electroless plating and wherein said step of filling said connective line trenches with a second copper layer comprises depositing said second copper layer by chemical vapor deposition.

33. The method according to claim 25 wherein said step of filling said via trenches with a first copper layer comprises depositing a first copper layer by chemical vapor deposition and wherein said step of filling said connective line trenches with a second copper layer comprises depositing a seed layer by one of the group of: physical vapor deposition and chemical vapor deposition and thereafter plating said second copper layer by one of the group of: electrochemical plating and electroless plating.

* * * * *